United States Patent
Müller

(10) Patent No.: US 6,949,751 B2
(45) Date of Patent: Sep. 27, 2005

(54) SLIT LENS ARRANGEMENT FOR PARTICLE BEAMS

(76) Inventor: Heiko Müller, Ortenauer Str. 17, 69126 Heidelberg (DE)

( * ) Notice: Subject to any disclaimer, the term of this patent is extended or adjusted under 35 U.S.C. 154(b) by 116 days.

(21) Appl. No.: 10/478,752
(22) PCT Filed: Jul. 24, 2002
(86) PCT No.: PCT/DE02/02722
§ 371 (c)(1), (2), (4) Date: Nov. 20, 2003
(87) PCT Pub. No.: WO03/015121
PCT Pub. Date: Feb. 20, 2003

(65) Prior Publication Data
US 2004/0149925 A1 Aug. 5, 2004

(30) Foreign Application Priority Data
Jul. 25, 2001 (DE) .......................... 101 36 190

(51) Int. Cl.$^7$ ............................... H01J 49/42
(52) U.S. Cl. .................................. 250/396 R
(58) Field of Search ................... 250/396 R, 492.23

(56) References Cited

U.S. PATENT DOCUMENTS 6,642,525 B2 * 11/2003 Kienzle et al. ...... 250/396 ML

* cited by examiner

Primary Examiner—Kiet T. Nguyen
(74) Attorney, Agent, or Firm—Edwin D. Schindler

(57) ABSTRACT

A slit lens arrangement for particle beams, and particularly for the projection of a mask onto a workpiece, includes a combined lens, having a cylinder lens and a quadrupole lens, the optical axes of which run parallel to each other, so that the optical axis of the quadrupole lens may be displaced in a parallel manner and which may have a gap-like opening between the pole shoes or in the electrodes with the same spatial relationship to each other. Both lenses are thus so arranged relative to each other, that the focussing of the quadrupole lens occurs in that plane in which the cylinder lens is not focussed, and the defocusing of the quadrupole lens occurs in that plane in which the cylinder lens focuses. Two combined lenses are provided with functionally identical elements arranged such that the optical axes of both lenses lie coaxial to each other, defining the mid-axis of the total system and in which the beam path is telescopic throughout the entire slit lens arrangement. The optical axis of the image is given by the optical axis of the quadrupole. Further, the diffraction plane, or aperture plane, for the total system lies between both combined lenses and fixes a point on the mid-axis, relative to which the combined lenses are arranged, so that the above are anti-symmetric to each other and simultaneously fill the condition that the separation of the first and the second combined lenses from the diffraction plane and the assembly and/or the fields of functionally identical elements in the combined lenses is in a ratio which corresponds to the image scale, preferably, reduction ratio. The shifts of the optical axes of the quadrupole lenses of both combined lenses occur in diametrically opposed directions, such that the size of the shifts are in a ratio to each other which corresponds to the image scale, preferably, the reduction ratio.

Figure 1:
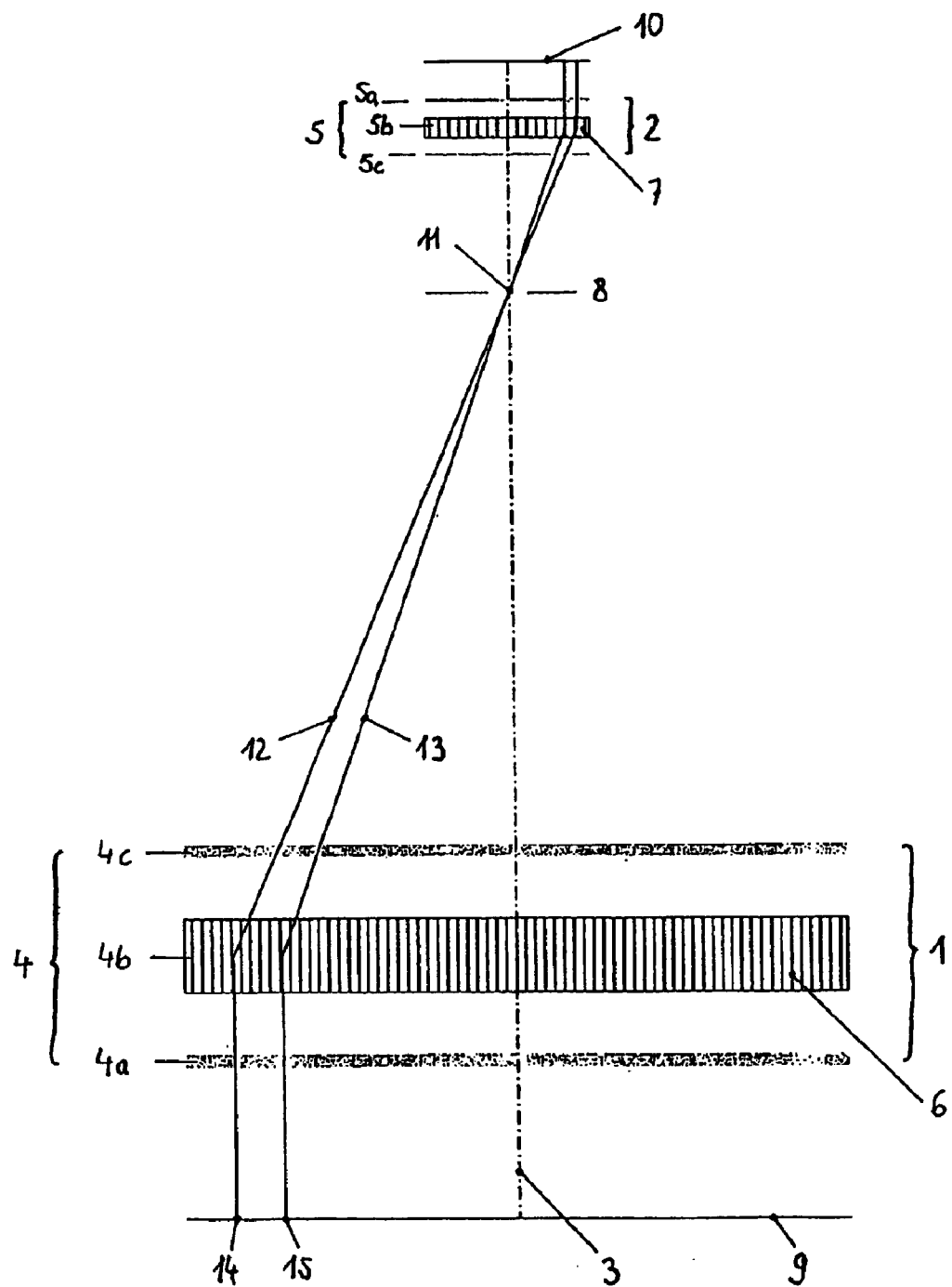

31 Claims, 2 Drawing Sheets

SLIT LENS ARRANGEMENT FOR PARTICLE BEAMS

BACKGROUND OF THE INVENTION

1. Field of the Invention

The invention relates to a slit lens arrangement for particle beams, in particular for the projection of a mask onto a workpiece, comprising a combined lens, which consists of a cylinder lens and a quadrupole lens, the optical axes of which run parallel to each other, the optical axis of the quadrupole lens being displaceable in a parallel manner, the cylinder lens and the quadrupole lens in each case having a gap-like aperture between the pole shoes or in the electrodes with the same spatial orientation to one other, and the two lenses being arranged relative to each other, such that the focusing of the quadrupole lens occurs in that plane in which the cylinder lens is not focused, and the defocusing of the quadrupole lens occurs in that plane in which the cylinder lens focuses.

In the production of microscopically fine structures, optical and electron-optical processes are used. The latter process provides the advantage of increased resolution because of the substantially smaller wavelength of the electrons. This means that the distance between closely adjacent point of an object can take on smaller values in the electron-optical process before the two points in the image plane of the imaging arrangement are no longer separable as individual points. In the production of electronic devices and integrated circuits on the surface of disc-shaped semiconductor crystals (wafers), electron-optical lithographic processes therefore play an important role.

For electron-projection lithography, short focal length electron lenses are required, which image the greatest possible area of the mask on the wafer.

2. Description of the Prior Art

In the prior art, electron-optical circular lens systems are known, in which, by superimposition of a correction field on the circuit lens field, the optical axis can be displaced in a parallel manner in directions perpendicular to the optical axis. Here, the position of the optical axis determines the position of the writing spot on the wafer. With dynamic superimposition of the correction field, it is therefore possible to write on a planar wafer with this arrangement. As a disadvantage of this system, it has been found that the diameter of the area to be written on is very much smaller than the bore radius of the lens pole shoe. The consequence of this is that, for writing on workpieces with extended dimensions, for example a wafer, this present arrangement must be equipped with a slide, which receives the workpiece and is displaceable perpendicular to the optical axis in two coordinate directions. The carriage, which is movable in two dimensions, with the required high precision, however is very complicated to design and is correspondingly expensive to produce. Also, because of the comparatively low displacement rate and the additional checking of the positioning, it limits the efficiency of the device.

In addition, two devices of different design for electron beam lithography are known, in which electron-optical elements with non-circular fields are employed.

The first device of this kind is disclosed in DE 196 34 456. It comprises an electrostatic cylinder lens and a magnetic quadrupole, which in combination form an image stigmatically in the same way as a circular lens. On the quadrupole, a magnetic dipole field can be superimposed, which effects a displacement of the optical axis in the direction of the longitudinal extension of the cylinder lens gap, the position of the optical axis again determining the position of the write dot on the wafer. The aforementioned combined lens retains its imaging properties during displacement of the optical axis over practically the entire length of the cylinder lens gap. Correspondingly, with the present non-circular system, compared with the aforementioned circular lens, substantially larger areas of the wafer can be written on without it being mechanically displaced. The disadvantage of the present device can be seen in the fact that the wafer must be written on point-by-point by the focused electron beam, and therefore the parallel projection of an extended mask region, as is conventional with electron projection lithography, is not possible.

The second device of the aforementioned type is disclosed in DE 196 44 857. It comprises an electrostatic cylinder lens consisting of at least three electrodes, of which the centre electrode in the longitudinal direction of the gap-like electrode aperture comprises segments insulated electrically from one another (comb electrodes). By virtue of this construction, different potentials can be applied to the individual segments of the centre electrode. In the present device, the potential distribution is chosen such that an electrostatic quadrupole is generated. Like the aforementioned device, the present arrangement thus also comprises a cylinder lens combined with a quadrupole lens, but with the difference that the quadrupole is electrical in nature. The imaging properties of the present lens system, in a disadvantageous manner, largely correspond to those of the aforementioned system.

SUMMARY OF THE INVENTION

Against this background it is the object of the invention to provide a slit lens arrangement for electron projection lithography, in which the mask image formed on the wafer covers a multiply greater image field about the optical axis, and the production of wafers is thus greatly simplified and accelerated.

This object can be achieved according to the invention by means of two different slit lens arrangements:

at least two combined lenses are provided one behind the other with, in each case, functionally identical elements, the optical axes of the combined lenses being displaceable relative to one another, the penetration points of the axes through the object plane and image plane determining the centres of the object and image fields which are to be imaged one on the other, and the double deflection of the optical axis taking place by means of the induced dipole field of the displaced quadrupole lenses, the beam path through the entire system being approximately telescopic, the diffraction plane (aperture plane) of the entire system lying between the two combined lenses and determining a point on the centre axis, with respect to which the combined lenses are arranged such that they lie antisymmetrically to one another and at the same time meet the condition that the distance of the first and second combined lenses from the diffraction plane (aperture plane) and the construction and/or the fields of functionally identical elements of the combined lenses from one another are in each case in a ratio to one another that corresponds to the imaging scale, preferably reduction scale, the displacements of the optical axis of the quadrupole lens of both combined lenses takes place in diametrically opposite directions, the magnitude of the displacements being in a ratio to one another that corresponds to the imaging scale, preferably the reduction scale.

The first slit lens arrangement according to the present invention is based on a combined lens that is known per se and described in the prior art, and comprises an electrostatic cylinder lens and a magnetic or electrostatic quadrupole lens. Here, the optical axis of the quadrupole lens is designed so as to be displaceable parallel to itself. The means for displacing the optical axis comprise electrostatic or magnetic fields, depending on the design of the quadrupole.

In the present invention, two combined lenses with functionally identical elements are provided, the optical axes of which lie coaxially to one another and define the centre axis of the entire system. The lenses are arranged such that the beam path through the entire system is telescopic. The diffraction plane of the entire system in such a case comes to lie between the two combined lenses and determines a point of symmetry on the centre axis. With respect to this point, the combined lenses are arranged such that they lie antisymmetrically to one another and at the same time meet the condition that the distance of the first and second combined lenses from the diffraction plane (aperture plane)

and the construction and/or the fields of functionally identical elements of the combined lenses are in each case in a ratio to one another that corresponds to the imaging scale, preferably the reduction scale.

DETAILED DESCRIPTION OF THE PREFERRED EMBODIMENTS

Corresponding to a further feature of the present invention, the optical axis of each of the quadrupole lenses of the combined lenses is displaceable in a parallel manner. The displacement is generated by superimposition of, usually time-dependent, dipole fields over the quadrupole fields of the quadrupole lenses. In this case, the dipole fields are in general predetermined such that a displacement of the optical axis of the quadrupole lens within the centre plane of the cylinder lens results. It is essential to the invention here that the displacement in the two quadrupole lenses takes place in diametrically opposite directions, and the magnitude of the displacements with respect to one another is in each case in a ratio that corresponds to the imaging scale.

This embodiment of the slit lens arrangement leads to the effect that the optical axes of the quadrupole lenses are displaceable in a wide range. With displacement in the longitudinal direction of the gap-shaped apertures, which are formed between the pole shoes or in the electrodes of the combined lenses, the order of magnitude of the displacement lies in the range of several centimetres. It is of decisive importance here that the stigmatic imaging properties of the entire system are retained during the displacement. The invention permits the projection range by a factor of 8–10 with respect to conventional electron projection lithography systems that are based on circular lenses with superimposed correction elements.

A central idea of the invention consists in constructing the entire system of two lenses with functionally identical elements and arranging them one behind the other such that—taking into account the reduction scale—they lie antisymmetrically to one another. This arrangement leads to the effect that—when a beam passes through the entire system—it passes through the functionally identical elements of the second combined lens in the opposite sequence to those of the first combined lens, and, as a consequence thereof, aberrations present in the individual combined lenses disappear for the entire system. In the present case this concerns a distortion, in which both the isotropic and anisotropic components and, in particular, the extra-axial chromatic aberrations disappear.

The advantageous consequence of the elimination of these aberrations is a comparatively large useful image field, that is to say a large range about the optical axis, which forms a sharp image on the workpiece. With the respect to the object plane, this means that a mask is covered in relatively large parts corresponding to the image plane and can therefore be imaged completely on the workpiece by wide range scanning. As a result, the times for transferring the mask can be considerably reduced, the production of, for example, wafers can thereby be considerably simplified.

According to a feature of the invention, it is provided that the present slit lens arrangement is used in electron or ion projection lithograph and in particular for the production of wafers. In such a device, the slit lens arrangement according to the invention serves to project a mask onto a workpiece, in particular a wafer. The writing onto the workpiece is usually carried out such that the optical axis of the imaging, and with it the sharply imaged area of the image field, is guided over the workpiece. In this case, the mask structure, which is reproduced in the image field, is transferred to the workpiece. The transfer of the displaceable image field thus takes place in parallel. For this process it is expedient if the displacement of the optical axis takes place in the longitudinal direction or almost in the longitudinal direction of the gap-shaped apertures formed between the pole shoes or in the electrodes of the combined lenses. By this means, it is ensured that, for displacement, the maximum possible displacement path is utilised.

In a deflection cycle of the aforementioned optical axis, a strip is written on the workpiece, the length of which corresponds approximately to the length of the gap-shaped apertures in the combined lenses and the width of which is determined by the diameter of the transferred image field. It is of advantage here that both parameters in the case of the slit-lens arrangement according to the present invention assume very much greater values than for slit-lens arrangements of the prior art.

To transfer the entire mask to the workpiece, it is necessary to design the mask and workpiece so as to be displaceable and to carry out the deflection cycle repeatedly. The writing beam starts again at the original edge of the workpiece, offset by a certain amount in the direction of movement of the workpiece, and writes a new strip on the workpiece. To ensure that each new strip adjoins contiguously with the preceding one, it is necessary to match the advance velocity and deflection velocity suitably to one another. According to a feature of the invention, it is therefore provided that the displacement of the workpiece takes place perpendicular to the longitudinal axis of the gap-shaped apertures and is carried out with a constant velocity $v1$, the displacement of the optical axes of the aforementioned quadrupole lenses consists of an advance movement and a return movement, the image field formed on the workpiece travelling, during the advance movement, with constant velocity v2 over the workpiece
and, for the ratio of the velocities, the following relationship applies:
v1/v2 is approximately equal to d/b,
wherein d is the diameter of the image field and b is the width of the workpiece transversely to its displacement direction.

Maintenance of the aforementioned relationship leads to the desired continuous writing onto the workpiece.

Advance of the workpiece and deflection of the optical axis leads to the strip written on the workpiece deviating by a small angle from the perpendicular to the advance direction. If it is desired to avoid this "slanting" strip on the workpiece, the direction of advance or deflection must be alternatively chosen such that the displacement of the optical axes of the aforementioned quadrupole lenses deviates from the longitudinal direction of the gap-shaped apertures, or the displacement of the workpiece deviates from the perpendicular to the longitudinal direction of the gap-shaped apertures, in each case by a corresponding small angle. The invention provides for corresponding embodiments, which are in particular to be advantageously used if structures are to be written on the wafer which extend perpendicular to the advance direction.

The following further developments of the invention concern advantageous design measures for the proposed slit-lens arrangement.

In a preferred embodiment of the slit-lens arrangement, it is provided to design the aforementioned cylinder lenses as electrostatic lenses and the aforementioned quadrupole lenses optionally as electrostatic or magnetic lenses. This embodiment permits a comparatively simple computation of the image aberrations of the slit-lens arrangement. For an optimisation of the imaging properties and in particular of the image-field size, a knowledge of the image aberrations is indispensable. The decision for electrostatic cylinder lenses in particular avoids the difficulties for analytical computation that occur with magnetic cylinder lenses as a result of the Lamor precession.

With the variant of the slit-lens arrangement with magnetic quadrupoles, it is of advantage if the quadrupole field can be generated from a rectangular aperture in a material of high magnetic permeability, at the edges of which current-carrying conductors run parallel to the optical axis of the combined lens. Here, the current flux in the conductors takes place parallel to the opposing edges of the aperture and contrary to the edges perpendicular thereto. The total of all currents through the aperture is preferably zero to avoid closed-loop magnetic field lines. With a technical implementation of this arrangement, the conductors are expediently formed by a coil wound upon a yoke, which is mounted in the interior of the aperture so that the conductors are oriented parallel to the optical axis.

With the aforementioned quadrupole, the displacement of the optical axis can be advantageously achieved by superimposing a magnetic dipole. A dipole field parallel to the longitudinal axis of the gap-shaped apertures in the electrodes of the cylinder lenses, in this case, effects a displacement of the optical axis of the quadrupole in just this direction. The dipole is most easily technically produced by means of two yokes, which have a gap between them and are made of a magnetically conductive material, and are in each case wound with a coil. The generation of the dipole field by mean of electrical currents permits the selective choice of the dipole intensity by corresponding setting of the excitation current. In addition it is possible, on the quadrupole field, to superimpose two dipole fields that are orthogonal to one another and to the optical axis in order to achieve any particular displacement of the optical axis over the surface of the rectangular aperture.

In the case of the second variant of the slit-lens arrangements with electrostatic quadrupoles, it is provided that at least one electrode in each case of the cylinder lenses, preferably in each case the inner electrode in the longitudinal direction of the gap-shaped aperture, is made of segments that are electrically insulated from one another (comb electrodes), and different potentials can be applied to the segments. This embodiment leads to a discrete translation symmetry of the lenses in the direction of their gap-shaped aperture. By means of suitable potentials on the individual segments of the electrode, both multipole fields and fields migrating in time over the electrodes can be implemented.

Of particular interest here, according to a feature of the invention, is the application to the segments of potentials that lead to the creation of a quadrupole field. The cylinder lens, and the quadrupole lens thus generated, have the same imaging properties as their electrical/magnetic counterpart in the preceding part of the description.

According to a feature of the invention, the potentials on the individual segments are time-dependent and migrate successively from one segment to the next. By this means, the quadrupole fields are displaced synchronously to the potential over the length of the gap-shaped aperture and, with them, the optical axis on which the imaging is based. Compared with the preceding slit-lens arrangement with mixed field types, the present embodiment offers the advantage that the deflection of the optical axis and, thereby, the movement of the writing beam can be carried out with a comparatively high speed, since the system is free of magnetic inertia.

With the present non-circular system, the imaging ray bundle generally also shows a non-circular cross section, depending on the geometrical location on the centre axis of the system. In particular in the aperture plane, different aperture angles are present in the two mutually perpendicular sections. As is known to a person skilled in the art, the aperture-dependent aberrations are reduced by means of diaphragms in this plane. It is therefore proposed, for limiting image aberrations, with the present slit-lens arrangement to provide non-circular diaphragms in the diffraction plane (aperture plane), preferably those with elliptical or rectangular shape. A diaphragm of this type results in reduction of the image aberrations in the plane of the workpieces, approximately independent of direction, and for a given resolution, a maximum transmission can be achieved. It is also conceivable to use circular aperture diaphragms, which lead to the aperture being trimmed more in one section than in the one perpendicular to it. Consequently, the image aberration limitation is differently developed in the two sections.

Of fundamental importance for high-resolution electron-optical lens systems is the energy spread of the electrons within the electron beam. The resolution here is all the better the smaller the energy spread and the (axial) chromatic aberration associated with it.

With an electron-optical system, the beam path of which—like the present slit-lens arrangement—has points (outside the plane of the workpiece), in which the electrons are focused, the energy spread of the electrons also depends, inter alia, on the stochastic beam interaction. By this is meant the phenomenon that the electrons, on passing through the aforementioned points, because of the high current densities prevailing in this region, are subject to scattering, which leads to an impairment of the achievable optical resolution. To avoid this disadvantage, for a slit-lens arrangement according to the invention, it is proposed to provide an electron in the region of the aperture diaphragm plane, and to apply a high potential thereto. The potential is to be chosen such that the energy of the electrons in the region of the aperture diaphragm plane is greater than in the mask plane and the workpiece plane. In an advantageous manner, a reduction of the scattering effect is thereby achieved.

A possible disadvantage of the embodiment of the proposed slit-lens arrangement with purely electrostatic lenses could be that, at the high beam voltages that are usually used, breakdown problems occur at the electrodes of the lenses. A possible remedy for this problem consists in the reduction of the energy of the electrons, which on the other hand would again lead to an increase in the chromatic aberration and thereby to a reduction of the optical resolution. This solution is therefore only acceptable if the chromatic aberration is reduced by other measures. According to the invention, this possible problem is countered by the present slit-lens arrangement in that the masks used can be designed as a self-supporting structure. With the masks currently used, the structures to be imaged on the workpiece are usually applied to a foil. With the use of masks of this kind in electron beam lithography, the inelastic scattering of electrons at the foil, however, leads to a spreading of the electron energy and therefore to an increase of chromatic aberration. By elimination of the carrier foils, the energy spreading that this causes is eliminated.

Further developments of the invention provide for additional multipole fields in the beam path of the present slit-lens arrangement. These fields serve for the more effective correction of possible image aberrations and correspondingly lead to a further enlargement of the image field.

A preferred embodiment here, in which further electrodes of the cylinder lenses and/or electrodes of additional cylinder lenses are designed as comb electrodes, that is to say have segments that are electrically insulated from one another in the longitudinal direction of the gap-shaped electrode aperture and to which different potentials can be applied.

In a particularly preferred embodiment, it is provided to apply potentials to the further electrodes which lead to the creation of additional quadrupole fields. In this case, the potentials are preferably determined so as to be time-dependent, such that the additional quadrupole fields are moved, synchronously to the two quadrupole fields already present, over the full length of the gap-shaped apertures. These additional quadrupole fields are advantageously utilized for the correction of image apertures, which originate in that position of the image field that deviates from the centre axis.

In the variant of the slit-lens arrangement according to the present invention with two combined lenses, which in each case comprise two electrostatic cylinder lenses and an integrated magnetic quadrupole, the segmentation of the further electrodes leads overall to an arrangement with four comb electrodes and two unsegmented electrodes. The four comb electrodes are used for generating further electrostatic quadrupoles, and the two unsegmented electrodes, as described above, for generating the magnetic quadrupoles. The magnetic quadrupoles here serve, in interaction with the magnetic dipoles, for (time-dependent) lateral displacement of the optical axis, while the further electrostatic quadrupoles, as mentioned above, serve for image-aberration correction.

Further, according to the present invention, it is also provided to superimpose higher-order multipole fields, preferably hexapole and octupole fields, on the individual quadrupole fields. Electrostatic fields are preferred here, which, in contrast to magnetic fields, as a result of their lack of magnetic inertia, permit a higher speed in changing the field intensities. According to a feature of the invention, these higher multipole fields can also be displaced in parallel, so that they can be guided so as to follow the movement of the optical axis. They thus serve, like the additional quadrupole fields, for more effective correction of the image aberrations.

In an alternative to the solution described above and its further embodiments, alternatively or additionally to the magnetic quadrupole fields in the combined lenses, a deflection magnet, consisting of two individual magnets, with a static field is provided for. This has the function of effecting the deflection of the optical axis of the imaging. In this solution it is provided in detail that two deflection magnets are provided between the first and second combined lenses, the pole shoes forming part of a magnet each have the same shape and are arranged so as to be mirror-symmetrical to the plane which is contained by those centre planes of the cylinder lenses that face in the longitudinal direction of the gap-shaped apertures, the time-constant magnetic fields of both magnets are designed such that rays that enter parallel into the magnetic field of the first magnet in the passage direction of the slit-lens arrangement are focused at that point of the centre axis that lies on the diffraction plane, and leave the second magnet as parallel rays again.

the magnitude of the displacements from one another being in a ratio that corresponds to the imaging scale, preferably the reduction scale.

The inclusion of a two-part deflection magnet in the present slit-lens arrangement leads to the centre axis of the arrangement assuming a curved shape that lies in one plane. In this plane there also lie those centre planes of the cylinder lenses that face in the longitudinal direction of the gap-shaped apertures, The pole shoes of the two deflection magnets are also designed so as to be mirror symmetrical to this plane; the plane thus represents a plane of symmetry of the system. The diffraction plane of the entire system lies between the two magnets.

The shape of the pole shoes is determined by the requirement that a deflection magnet must act like an optical imaging system. Where the deflection magnet is used as a substitute for the magnetic deflection fields in the combined lenses, rays that enter parallel into the magnetic field of the first magnet in the passage direction of the slit-lens arrangement are focused at that point of the centre axis that lies on the diffraction plane, and leave the second magnet as parallel rays again.

For the aforementioned slit-lens arrangement, the embodiment with the deflection magnet represents a possible alternative. However, the proposed deflection magnet also forms a basis for the second solution of the problem according to the invention. This solution is characterised by the features described in claim 21.

With this solution, the combined lenses have in each case been replaced by a group of four displaceable magnetic quadrupoles. The entire system consequently consists—passing through the system in the beam direction—of a first group of four and a first deflection magnet in front of the diffraction plane, and a second deflection magnet and a second group of four behind the diffraction plane. In this case, displaceable multipoles can be generated by additional windings on the coil bodies of the quadrupole lenses, and are advantageously used for correction of image aberrations. The fundamental optical properties of this slit-lens arrangement largely correspond to those of the first solution according to the invention.

The advantage of the present arrangement can be seen in the purely magnetic mode of operation of the system. It permits high electrical acceleration voltages for the electrons and, therefore, low chromatic aberrations and correspondingly large image fields of the arrangements. Possible breakdown problems at electrostatic lenses are a priori eliminated, since the system does not contain any such lenses.

BRIEF DESCRIPTION OF THE DRAWING FIGURES

Further details, features and advantages of the invention can be taken from the following part of the description. In this part, two exemplary embodiments of the proposed slit-lens arrangement are explained in greater detail with reference to a schematic drawing, wherein FIG. 1 shows a schematic diagram of an embodiment according to the first solution, FIG. 2 shows a schematic diagram of an embodiment according to the second solution,

DETAILED DESCRIPTION OF THE DRAWING FIGURES

Figure 2:
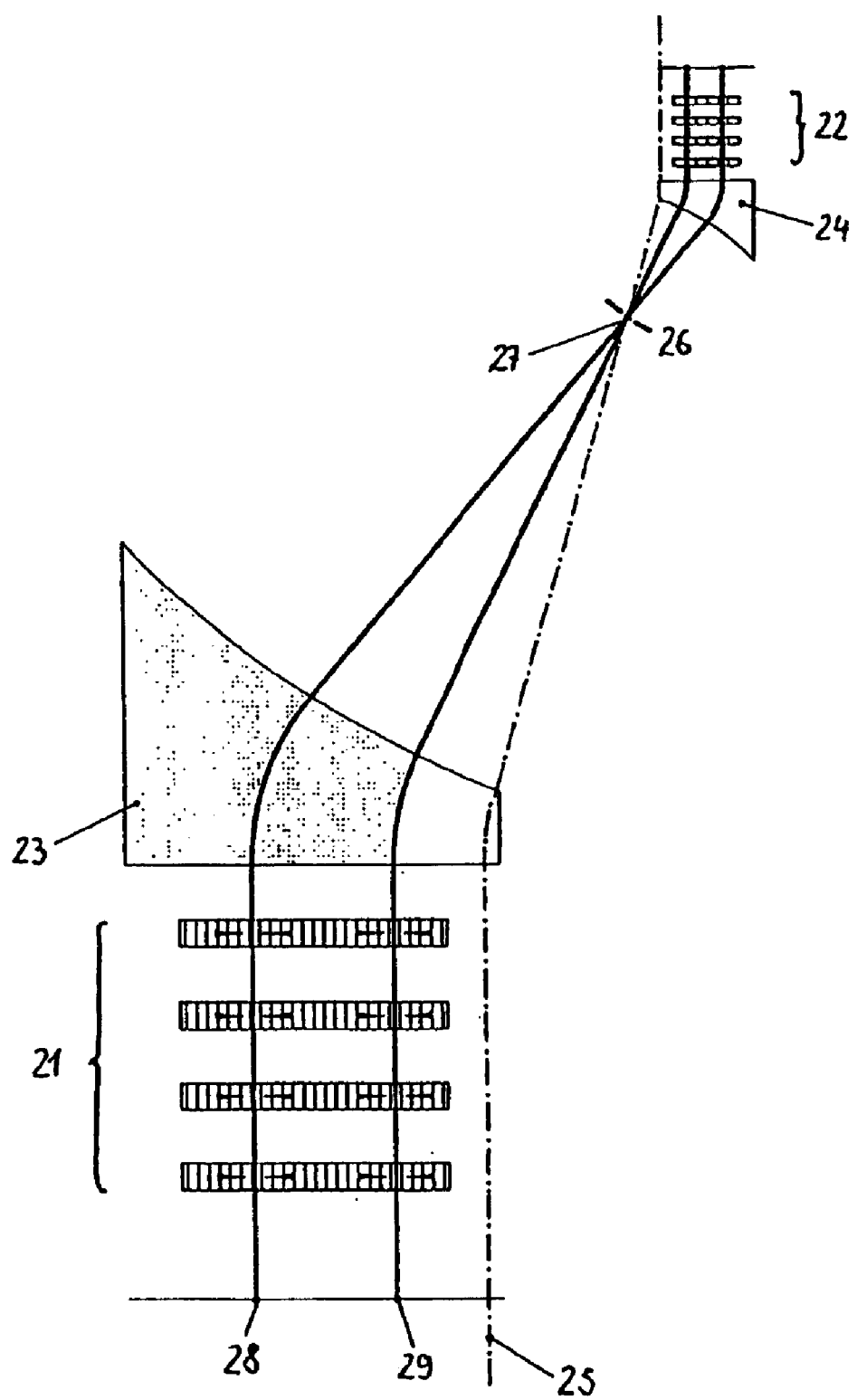

FIG. 1 shows the components and, by indication, the beam path through an arrangement, which consists of a first 1 and second combined lens 2, which are arranged collinear to one another along the centre axis 3 of the entire system. Each combined lens consists of an electrostatic cylinder lens 4 and 5 respectively, with in each case 3 electrodes 4a, 4b, 4c and 5a, 5b, 5c respectively and a magnetic quadrupole 6 and 7 respectively integrated on the centre electrode 4b and 5b respectively. The gap-shaped apertures in the electrodes of the cylinder lenses are arranged such that its longitudinal direction extends parallel to the drawing plane, the centre plane of the gap lying in the drawing plane. In the present representation they are covered by the outlines of the electrodes.

The outer electrodes 4a, 4c and 5a, 5c are in each case designed as comb electrodes, that is to say they are constructed, in the direction of the longitudinal extension of the gap, from mutually insulated segments, to which in each case a potential can be individually applied. The potentials can be specified such that they lead to the creation of quadrupole, hexapole or else octupole fields, which migrate in the longitudinal direction of the comb electrodes. Fields of this kind can be advantageously used for correction of optical imaging aberrations.

The reference character 8 indicates the position of the diffraction plane. As can be taken from the drawing, it lies between the combined lenses 1 and 2. The mask is identified by the reference character 9 and the workpiece by the character 10.

With respect to point 11, which results as the point of intersection of the diffraction plane 8 with the centre axis 3, the combined lenses 1 and 2, are arranged such that they lie antisymmetrically to one another, and at the same time meet the condition that the distance of the first and second combined lenses from the diffraction plane (aperture plane), the construction and the fields of functionally identical elements of the combined lenses are in each case in the ratio to one another of the reduction scale.

Numbers 12 and 13 denote two optical axes, which are essential for imaging the mask points 14 and 15, to represent a complete beam path. The optical axes of the quadrupoles 6, 7 for the present slit-lens arrangement are designed so as to be displaceable in a parallel manner. The displacement of the quadrupole axes is achieved by means of magnetic dipoles (not shown), which in each case act at the location of the quadrupoles and are aligned in the plane of the drawing perpendicular to the centre axis 3.

FIG. 2 shows, in the same form of representation, a slit-lens arrangement, which consists of a first 21 and a second group of four 22 quadrupoles, and a first 23 and second deflection magnet 24. The centre axis 25 of the entire system in this embodiment takes on a curved shape lying in the drawing plane. The pole shoes of the two magnets 23, 24 are arranged as mirror-images above and below the drawing plane. Their form is designed such that beams entering the magnetic field of the first magnet 23 are focused at that point 27 of the centre axis 25 lying on the diffraction plane 26, and they leave the second magnet 24 again as a parallel beam.

With respect to point 27 on the diffraction plane 26 of the entire system, the aforementioned groups of four 21, 22 and the deflection magnets 23, 24 are arranged such that they lie antisymmetrically to one another and at the same time meet the condition that the distance, measured along the (curved) centre axis 25 of the entire system, from the functionally identical element of the first and second group of four 21, 22 and of the first and second deflection magnets 23, 24 from the diffraction plane 26, and the construction and/or the fields of the deflection magnets and the functionally identical elements of the groups of four with respect to one another are in each case in a ratio that corresponds to the imaging scale.

The reference characters 28, 29 denote two positions of the optical axis which are essential for the imaging of different mask regions on the workpiece.

In the present arrangement, a purely magnetic mode of operation is present, while the system shown in FIG. 1 operates with electrical and magnetic fields. Both solutions provide a large useful image field, or permit the representation of a large section of the mask on the workpiece. For transferring the complete mask, therefore, only a wide-ranging scanning is necessary, as a result of which the times for producing wafers can be considerably reduced.

What is claimed is:

1. A slit lens arrangement for particle beams, such as for a projection of a mask onto a workpiece, said slit lens arrangement comprising:

at least two combined lenses positioned one behind another, each combined lens or said at least two combined lenses having a cylinder lens and a quadrupole lens with an optical axis of each of said cylinder lens and said quadrupole lens running parallel to one another, said optical axis of said quadrupole lens being displaceable in a parallel manner, said cylinder lens and said quadrupole lens each having a gap-shaped aperture between pole shoes or in electrodes with the same spatial orientation to one another with said cylinder lens and said quadrupole lens being aligned relative to one another, so that focusing said quadrupole lens of each said combined lens takes place in a section in which said cylinder lens is not focused and defocusing of said quadrupole lenses takes place in a section wherein said cylinder lens focuses;

optical axes of said at least two combined lenses being displaceable relative to one another, with penetration points of said optical axes of said at least two combined lenses through an object plane and an image plane determining centers of said object plane and said image plane which are to be imaged one on the other, a double deflection of said optical axis taking place via an induced dipole field of a displaced said quadrupole lenses;

a beam path through said slit lens arrangement being approximately telescopic; and, a diffraction plane, or aperture plane, of said slit lens arrangement lying between said at least two combined lenses and determining a point on a center axis, with respect to which said at least two combined lenses are arranged, so that said at least two combined lenses lie antisymmetrically to one another and at the same time meet a condition that a distance of the first and second combined lenses from said diffraction plane, or aperture plane, and a construction or fields of functionally identical elements of said at least two combined lenses from one another are in each case in a ratio that corresponding to an imaging scale, with said displacements of said optical axis of each said quadrupole lens of said at least two combined lenses taking place in diametrically opposite directions with a magnitude of the displacements from one another being in a ratio corresponding to said imaging scale.

2. The slit lens arrangement for particle beams according to claim 1, wherein said displacement of said optical axes of said quadrupole lenses takes place in a direction of a longitudinal axis of the gap-shaped apertures.

3. The slit lens arrangement for particle beams according to claim 2, wherein said displacement of the optical axes of said quadrupole lenses from the longitudinal direction of said gap-shaped apertures or the displacement of a workpiece deviates from the perpendicular to the longitudinal direction of said gap-shaped apertures.

4. The slit lens arrangement for particle beams according to claim 1, further comprising a workpiece displaceable perpendicularly to the center axis of said slit lens arrangement and perpendicularly to the longitudinal axis of said gap-shaped apertures, the displacement of the workpiece taking place with a first constant velocity (v1), and the displacement of the optical axes of said quadrupole lenses comprising an advance movement and a return movement with an image field formed on the workpiece travelling, during the advance movement, with a second constant velocity (v2) over the workpiece and, for the ratio of the velocities, the following relationship applies:

v1/v2 is approximately equal to d/b, wherein d is a diameter of the image field and b is a width of the workpiece transversely to its displacement direction.

5. The slit lens arrangement for particle beams according to claim 1, wherein said imaging scale is a reduction scale.

6. The slit lens arrangement for particle beams according to claim 1, wherein said cylinder lenses and said quadrupole lenses are electrostatic lenses.

7. The slit lens arrangement for particle beams according to claim 1, wherein said cylinder lenses are electrostatic lenses and said quadrupole lenses are magnetic lenses.

8. The slit lens arrangement for particle beams according to claim 7, wherein a quadrupole field is generated from an aperture in a material of high magnetic permeability having edges from which current-carrying conductors extend parallel to said optical axis of said combined lens, and with a current flow in said conductors being parallel to opposite edges of the aperture and contrary to the edges perpendicular thereto.

9. The slit lens arrangement for particle beams according to claim 8, wherein a magnetic dipole field is superimposed on said quadrupole field.

10. The slit lens arrangement for particle beams according to claim 7, further comprising at least one electrode in each said cylinder lenses in a longitudinal direction of the gap-shaped aperture is made of segments that are electrically insulated from one another, so that different potentials are able to be applied to said segments.

11. The slit lens arrangement for particle beams according to claim 10, further comprising an inner lens for each said cylinder lens with said inner lens of each cylinder lens having said at least one electrode.

12. The slit lens arrangement for particle beaus according to claim 10, wherein said segments are capable of producing an electrostatic quadrupole lens via application of a potential to said segments.

13. The slit lens arrangement for particle beams according to claim 12, wherein the potential on each individual segment of said segments is time-dependent and migrate from one said individual segment to an adjacent said individual segment.

14. The slit lens arrangement for particle beams according to claim 1, wherein said diffraction plane has an elliptical aperture therein.

15. The slit lens arrangement for particle beams according to claim 1, wherein said diffraction plane has a rectangular aperture therein.

16. The slit lens arrangement for particle beams according to claim 1, further comprising an electrode in the vicinity of said diffraction plane to which a comparatively high electrical potential is able to be applied.

17. The slit lens arrangement for particle beams according to claim 1, further comprising a mask through which said beam path passes for projection upon a workpiece.

18. The slit lens arrangement for particle beams according to claim 17, wherein said mask is a self-supporting structure.

19. The slit lens arrangement for particle beams according to claim 1, wherein at least some of said electrodes for said cylinder lenses are comb electrodes.

20. The slit lens arrangement for particle beams according to claim 19, wherein said comb electrodes are capable of generating time-dependent quadrupole fields which are displaceable in a parallel manner.

21. The slit lens arrangement for particle beams according to claim 1, wherein said quadrupole lenses generate quadrupole fields with higher-order multipole fields being superimposed on said quadrupole fields.

22. The slit lens arrangement for particle beams according to claim 21, wherein said higher-order multipole fields are hexapole fields.

23. The slit lens arrangement for particle beams according to claim 21, wherein said higher-order multipole fields are octupole fields.

24. The slit lens arrangement for particle beams according to claim 21, wherein said higher-order multipole fields are electrical fields.

25. The slit lens arrangement for particle beams according to claim 21, wherein said higher-order multipole fields are a hexapole field and an octupole field displaceable in a parallel manner.

26. The silt lens arrangement for particle beams according to claim 1, wherein said at least two combined lenses are a first combined lens and a second combined lens and further comprising a first deflection magnet and a second deflection magnet of similar shape and arranged to be mirror symmetrical to a plane containing center planes of said cylinder lenses facing in a longitudinal direction of said gap-shaped apertures, said first deflection magnet and said second deflection magnet each having time-constant magnetic fields constructed so that rays entering in parallel into said time-constant magnetic fields of said first deflection magnet in a ray-penetration direction of said slit-lens arrangement are focused at a point of a center axis that lies on a diffraction plane, and said rays leave said second deflection magnet as parallel rays again, with an optical axis of an image being displaced in both said first deflection magnet and said second deflection magnet in diametrically opposite direction with a magnitude of the displacement with relative to one another being in a ratio that corresponds to an imaging scale.

27. The slit lens arrangement for particle beams according to claim 26, wherein said imaging scale is a reduction scale.

28. A slit lens arrangement for particle beams, such as for a projection of a mask onto a workpiece, said slit lens arrangement comprising:

a plurality of quadrupole lenses;

a first deflection magnet and a second deflection magnet and two groups of quadrupoles, including functionally identical elements, said first deflection magnet and said second deflection magnet having pole shoes of similar shape and arranged mirror-symmetrically relative to a plane, with said planes of said first deflection magnet and said second deflection magnet lying coplanar to one another and defining a central plane of said slit lens arrangement, said plurality of quadrupole lenses having optical axes lying in said central plane and being aligned parallel to one another, said optical axes displaceable in parallel via superimposed dipole fields;

a beam path through said slit lens arrangement being approximately telescopic, with magnetic fields of said first deflection magnet and said second deflection magnet being constructed so that rays entering the magnetic field of the first deflection magnet in a ray passage direction of the slit lens arrangement are focused on said central plane of said slit lens arrangement and leaving said second deflection magnet as parallel beams, the central plane passing through a point standing perpendicular to said central plane defining a diffraction plane, said plurality of quadrupole lenses and said first deflection magnet and said second deflection magnet being arranged relative to said point, so that they lie antisymmetrically to one another and, at the same time, meet a condition that a distance, measured along a center axis of said slit lens arrangement of said functionally identical elements of said two groups of quadrupoles and of said first deflection magnet and said second deflection magnet from said diffraction plane and the magnetic fields of said first deflection magnet and said second deflection magnet and of the functionally identical elements are in a ratio of one another corresponding to an imaging scale, with a magnitude of displacements from one another being in a ratio corresponding to said imaging scale.

29. The slit lens arrangement for particle beams according to claim 28, wherein said imaging scale is a reduction scale.

30. The slit lens arrangement for particle beams according to claim 28, wherein said two groups of quadrupoles comprise four quadrupole lenses.

31. The slit lens arrangement for particle beams according to claim 28, wherein said two groups of quadrupoles are magnetic.

* * * * *